United States Patent
Strachan et al.

(10) Patent No.: US 10,396,175 B2
(45) Date of Patent: Aug. 27, 2019

(54) NANOGAPS ON ATOMICALLY THIN MATERIALS AS NON-VOLATILE READ/WRITABLE MEMORY DEVICES

(71) Applicants: Douglas Robert Strachan, Lexington, KY (US); Abhishek Sundararajan, Lexington, KY (US); Mathias Joseph Boland, Lexington, KY (US)

(72) Inventors: Douglas Robert Strachan, Lexington, KY (US); Abhishek Sundararajan, Lexington, KY (US); Mathias Joseph Boland, Lexington, KY (US)

(73) Assignee: UNIVERSITY OF KENTUCKY RESEARCH FOUNDATION, Lexington, KY (US)

( * ) Notice: Subject to any disclaimer, the term of this patent is extended or adjusted under 35 U.S.C. 154(b) by 0 days.

(21) Appl. No.: 14/952,433

(22) Filed: Nov. 25, 2015

(65) Prior Publication Data

US 2016/0155839 A1 Jun. 2, 2016

Related U.S. Application Data

(60) Provisional application No. 62/084,290, filed on Nov. 25, 2014.

(51) Int. Cl.
*H01L 29/66* (2006.01)
*H01L 29/423* (2006.01)
(Continued)

(52) U.S. Cl.
CPC .... *H01L 29/66484* (2013.01); *H01L 29/1606* (2013.01); *H01L 29/24* (2013.01);
(Continued)

(58) Field of Classification Search
None
See application file for complete search history.

(56) References Cited

U.S. PATENT DOCUMENTS 3,950,738 A * 4/1976 Hayashi .................. G11C 11/42
257/432
6,674,121 B2 * 1/2004 Misra ..................... B82Y 10/00
257/324
(Continued)

FOREIGN PATENT DOCUMENTS

JP 2009205709 A 9/2009
JP 2010141046 A 6/2010
(Continued)

OTHER PUBLICATIONS

Havener et al. "Hyperspectral Imaging of Structure and Composition in Atomically Thin Heterostructures", Jul. 10, 2013, American Chemical Society, 13, pp. 3942-3946.*
(Continued)

*Primary Examiner* — Telly D Green
(74) *Attorney, Agent, or Firm* — King & Schickli, PLLC

(57) ABSTRACT

The present invention relates to the presence of nanogaps across a metal dispersed over an atomically-thin material, such that the nanogap exposes the atomically-thin material. The resulting device offers an ultra-short gap with ballistic transport and demonstrated switching in the presence of a gate or dielectric material in close proximity to the channel.

19 Claims, 13 Drawing Sheets

(51) Int. Cl.
*H01L 29/24* (2006.01)
*H01L 29/16* (2006.01)
*H01L 29/78* (2006.01)
*H01L 29/778* (2006.01)
*H01L 29/788* (2006.01)

(52) U.S. Cl.
CPC .. *H01L 29/42324* (2013.01); *H01L 29/66825* (2013.01); *H01L 29/778* (2013.01); *H01L 29/7831* (2013.01); *H01L 29/7881* (2013.01); *H01L 29/42356* (2013.01)

(56) References Cited

U.S. PATENT DOCUMENTS

| | | | |
|---|---|---|---|
| 6,897,009 | B2 | 5/2005 | Johnson, Jr. et al. |
| 7,612,358 | B2 | 11/2009 | Joo et al. |
| 7,902,586 | B2 | 3/2011 | Naitoh et al. |
| 7,990,751 | B2 | 8/2011 | Masuda et al. |
| 8,008,213 | B2 | 8/2011 | Xiao et al. |
| 8,022,383 | B2 | 9/2011 | Naitoh et al. |
| 8,093,518 | B2 | 1/2012 | Naitoh et al. |
| 8,168,964 | B2 * | 5/2012 | Hiura .............. B82Y 10/00 257/14 |
| 8,207,593 | B2 | 6/2012 | Bratkovski et al. |
| 8,334,525 | B2 | 12/2012 | Nakai et al. |
| 8,395,185 | B2 | 3/2013 | Furuta et al. |
| 8,507,888 | B2 | 8/2013 | Aoyama et al. |
| 8,653,912 | B2 | 2/2014 | Furuta et al. |
| 8,809,931 | B2 | 8/2014 | Nakai et al. |
| 8,823,075 | B2 * | 9/2014 | Purayath .......... H01L 21/28273 257/321 |
| 8,841,650 | B2 * | 9/2014 | Raza ................ B82Y 10/00 257/24 |
| 8,860,000 | B2 | 10/2014 | Yamamoto et al. |
| 9,337,273 | B2 * | 5/2016 | Nourbakhsh |
| 9,399,581 | B2 * | 7/2016 | Grobert .............. C01B 31/0461 |
| 9,608,101 | B2 * | 3/2017 | Kis |
| 2003/0111670 | A1 * | 6/2003 | Misra ................ B82Y 10/00 257/200 |
| 2005/0062097 | A1 * | 3/2005 | Misra ................ B82Y 10/00 257/324 |
| 2010/0090265 | A1 * | 4/2010 | Bhattacharyya ....... B82Y 10/00 257/315 |
| 2010/0102292 | A1 * | 4/2010 | Hiura ................ B82Y 10/00 257/9 |
| 2010/0214012 | A1 * | 8/2010 | Raza ................ B82Y 10/00 327/537 |
| 2012/0161098 | A1 * | 6/2012 | Hiura ................ C23C 16/0218 257/9 |
| 2012/0205606 | A1 | 8/2012 | Lee et al. |
| 2013/0018599 | A1 * | 1/2013 | Peng ................ B82Y 15/00 702/30 |
| 2013/0043455 | A1 | 2/2013 | Bateman |
| 2013/0313522 | A1 * | 11/2013 | Nourbakhsh ....... H01L 29/1606 257/29 |
| 2014/0048799 | A1 | 2/2014 | Tour et al. |
| 2014/0061590 | A1 * | 3/2014 | Lee ................ H01L 29/1606 257/29 |
| 2014/0151778 | A1 * | 6/2014 | Purayath .......... H01L 21/28273 257/316 |
| 2014/0197459 | A1 * | 7/2014 | Kis ................. H01L 29/66742 257/194 |
| 2015/0064098 | A1 * | 3/2015 | Grobert .............. C01B 31/0461 423/448 |
| 2016/0284811 | A1 * | 9/2016 | Yu .................. H01L 29/454 |

FOREIGN PATENT DOCUMENTS

| | | | | |
|---|---|---|---|---|
| JP | | 2012114226 A | 6/2012 | |
| WO | | 2012085627 A1 | 6/2012 | |
| WO | WO 2012093360 A1 * | | 7/2012 | ....... H01L 29/66742 |

OTHER PUBLICATIONS

English Machine Translation of JP 2009205709(A).
English Machine Translation of JP 2010141046 (A) (Abstract only).
English Machine Translation of JP 2012114226 (A).

* cited by examiner

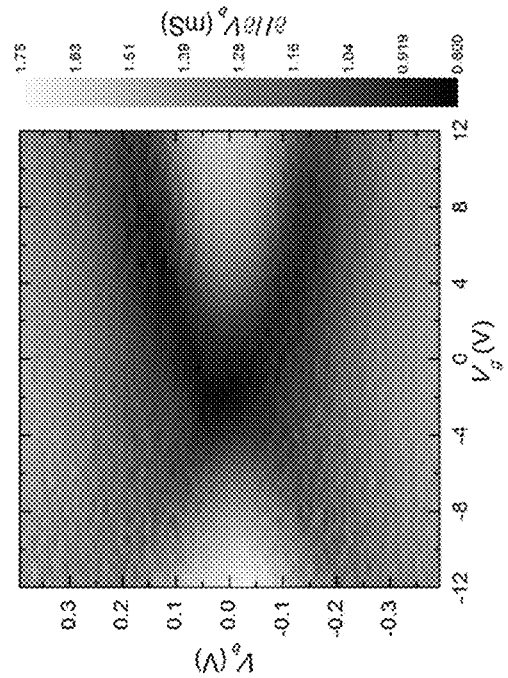
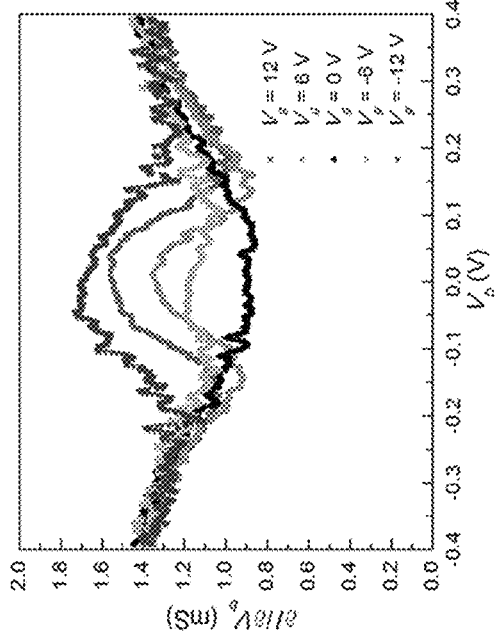
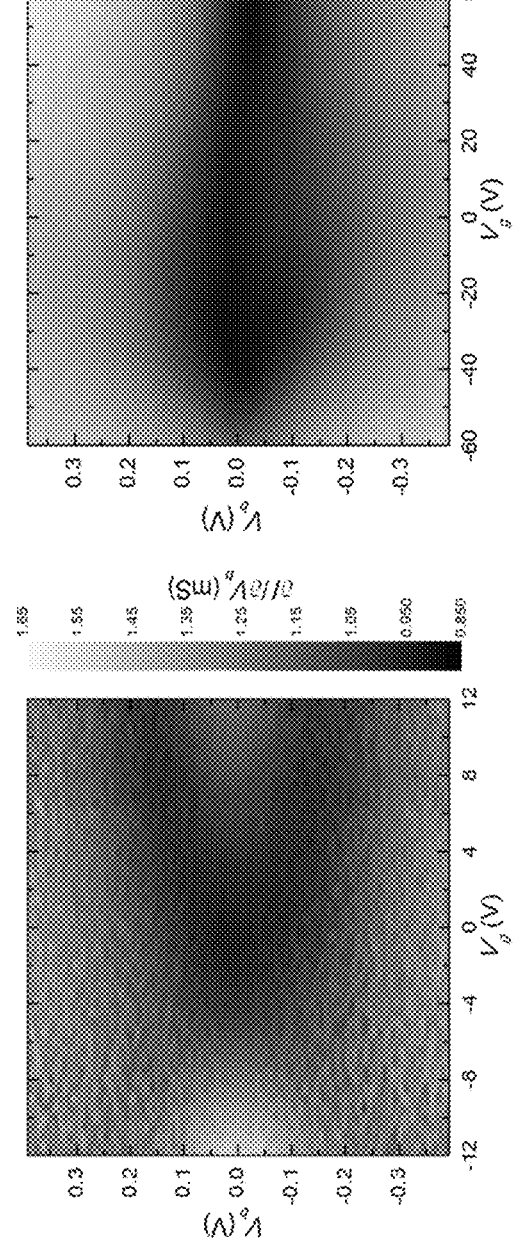

NANOGAPS ON ATOMICALLY THIN MATERIALS AS NON-VOLATILE READ/WRITABLE MEMORY DEVICES

RELATED APPLICATIONS

This application claims priority to U.S. Provisional Patent Application 62/084,290, filed Nov. 25, 2014, which is hereby incorporated by reference it its entirety.

TECHNICAL FIELD

The present invention relates generally to the presence of nanogaps on atomically thin materials that can show non-linearity through local charge exchange and the effects of ballistic transport.

BACKGROUND

Since the advent of the electronics era, there has been a long-term trend of scaling electronic component sizes downwards in order to improve their performance and efficiency. Atomically-thin materials are ideal components of such extremely-scaled devices,[1] as these materials already have the smallest achievable thickness (Frindt *Phys. Rev. Lett.* 1972, 28 (5), 299-301). Graphene, one such atomically-thin material consisting of $sp^2$ bonded carbon,[2] has been of particular interest for high-speed electronics (Geim et al. *Nature Materials* 2007, 6, 183-191; Zheng et al. *Sci Rep* 2013, 3; Ganapathi et al. *IEEE Trans. Electron Devices* 2013, 60 (3), 958-964; Koswatta et al. *IEEE Trans. Microw. Theory Tech.* 2011, 59 (10), 2739-2750). Ultra-short graphene field effect transistors (GFETs) are promising for high speed applications due in part to their potential ballistic transport of charge carriers, where the mean free path is comparable to the relevant channel length (Ganapathi et al. *IEEE Trans. Electron Devices* 2013, 60 (3), 958-964; Koswatta et al. *IEEE Trans. Microw. Theory Tech.* 2011, 59 (10), 2739-2750; Pugnaghi et al. *J. Appl. Phys.* 2014, 116 (11); Grassi et al. *IEEE Trans. Electron Devices* 2013, 60 (1), 140-146).

Reducing the size of devices is one of the driving paradigms of the nanoelectronics and semiconductor industries for significantly improving their performance and efficiencies. In addition, fast all-electronic nonvolatile memory devices and nonlinear devices are highly desirable for both speed and efficiency. The present invention provides an ultra-short nanogap nonlinear device with a channel on the size scale of approximately 10 nm, or smaller, comprising an atomically-thin channel comprising either one or two additional gate electrodes. These devices can show both non-volatile memory and clear signatures of ballistic, non-scattering, transport which is important for high-speed applications.

SUMMARY OF THE INVENTION

The present invention provides a non-volatile memory element, comprising an atomically-thin layer on top of a gate layer and a metallic layer dispersed on top of the atomically-thin layer, wherein a nanogap channel of a width of about 0.1 nm to 10 nm passes entirely across the metallic layer and exposes the atomically thin layer such that the metallic layer is divided by the nanogap channel into a source electrode and a drain electrode. The resulting memory is accordingly non-volatile and provides non-linear behavior which is of benefit for improved switching in coordination with the gate. Further, the resulting nanogap channel demonstrates ballistic behavior with no scattering, of benefit to low-dissipation high speed applications.

The non-volatile memory element may further comprise a dielectric layer between the gate layer and the atomically thin layer. Optionally, the element may also feature an upper gate layer and/or an upper dielectric layer.

The non-volatile memory element may further comprise a floating gate embedded in the dielectric layer.

The atomically thin layer may comprise thin materials considered two dimensional in shape, such as graphene, $MoS_2$, or other transition metal dichalcogenides.

The gate layer may be on top of a substrate. The gate layer may comprise a metal or other atomically-thin conducting material. The substrate may comprises an insulating material, such a silicon, silicon oxide, aluminum oxide, sapphire, germanium, gallium arsenide, indium phosphide and silicone/germanium alloys.

The metallic layer may comprise, for example, Au, Ni, Pt, Pd, and Al. The metallic layer may be locally-thinned or constricted into a bowtie geometry on the atomically-thin layer.

The present invention also provides a method of formulating a non-volatile memory element comprising: assembling three-layered structure comprising an atomically-thin layer on a dielectric layer, which in turn is on a gate layer; depositing on the atomically-thin layer a metallic layer with a locally-thinned or bowtie geometry; etching to remove remaining exposed elements of the atomically-thin layer; and introducing a nanogap at the bowtie geometry across the metallic layer by feedback controlled electromigration.

BRIEF DESCRIPTION OF THE DRAWINGS

FIG. 1 shows a cross-sectional illustration of approach for placing a metallic nanogap onto an atomically-thin material.

FIG. 2 shows electromigrated metallic nanogaps on monolayer graphene.

FIG. 3 shows a Read/Writable nanogap on graphene device.

FIG. 4 shows an overview and fabrication of an ultra-short channel graphene field effect transistor (GFET).

FIG. 5 shows nonlinear conductance of an ultra-short GFET. FIG. 5a shows differential conductance of an ultra-short single-layer GFET for various gate voltages at 77 K. FIG. 5b shows differential conductance map as a function of applied bias voltage and gate voltage at 77 K for the single-layer device in FIG. 5a. FIG. 5c shows differential conductance map as a function of applied bias voltage and gate voltage at room temperature of 293 K for the single-layer device in FIG. 5a. FIG. 5d shows differential conductance map as a function of applied bias voltage and gate voltage for a bi-layer GFET at 77 K showing distinct behavior compared to the single-layer device.

FIG. 6 shows an ultra-short channel GFET ballistic model.

FIG. 8 shows an overview of electron transport within three embodiments of the device disclosed herein.

DETAILED DESCRIPTION

The present invention provides in part for an ultra-short sub-10 nm nanogap device comprising an atomically-thin channel with either one or two additional gate electrodes. The ultra-short channels provide large electric fields that can induce charge exchange with a nearby dielectric or a floating gate electrode. The resulting transport through the device is ballistic and, due to the extremely small length scales, the presence of the gate or dielectric enables rapid nonvolatile switching. The charge written depends on the potential applied to a global gate electrode during a high-bias write step. Since the charge state is only set at high bias, the device permits the separate reading and writing of the device. This separation of the read and write sequence allows for parallel reading and writing of non-volatile memory cells using a single global gate electrode. In addition, the device scheme allows for multi-bit storage that is resolvable through an entire gate electrode sweep.

In the case where the gate electrodes are separated from the channel on the 10 nm scale, the voltage applied between the source and drain electrodes should induce charging of the dielectric or floating gates. This can result in two-terminal memristive behavior, also of use for high-speed nonvolatile memory devices.

The nanogap device of the present invention comprises a gate layer on top of a substrate. Layered on the gate layer is a dielectric layer, which may optionally have embedded within a floating gate. Layered on the dielectric layer is an atomically thin layer, such as a single layer of graphene, transition metal dichalcogenides (like $MoS_2$), and black phosphrous, or two or more layers, including few-layer graphene (FLG). A metallic layer is deposited on top of the atomically thin layer and a nanogap introduced as described herein across the metallic layer, thereby creating a source and drain electrode. Optionally, the device may further comprise an additional upper dielectric and/or gate layer.

Figure 8A:
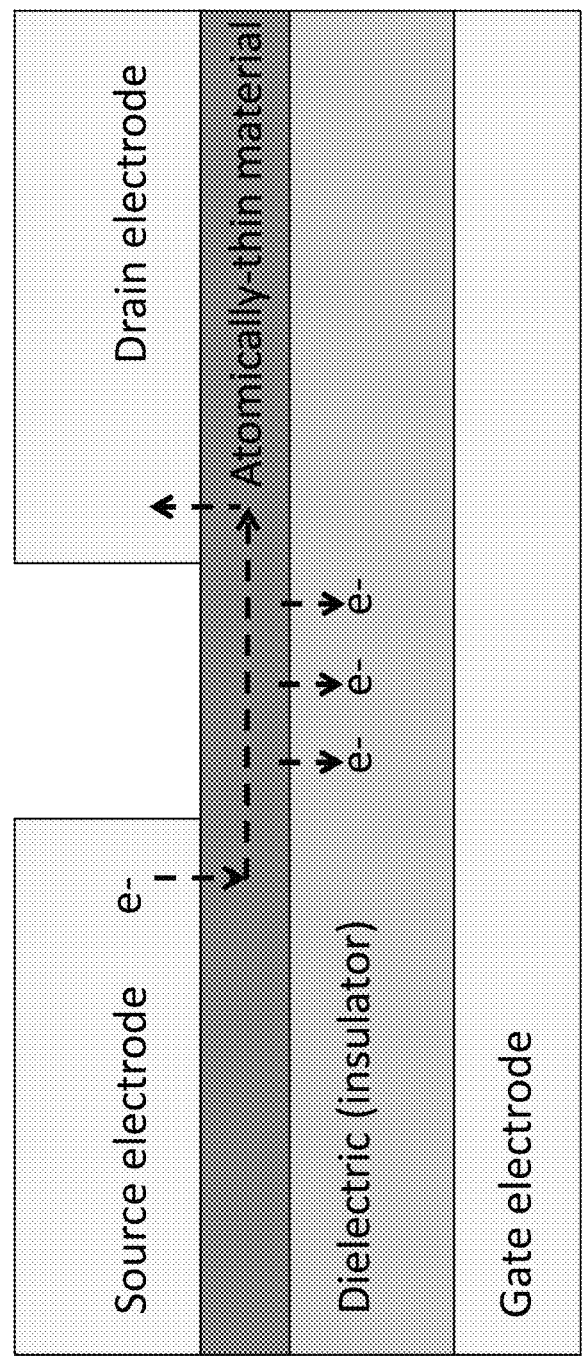
FIG. 8a shows control with a bottom gate and a dielectric that stores the charge in traps. The transport through the atomically-thin material is ballistic.
Figure 8B:
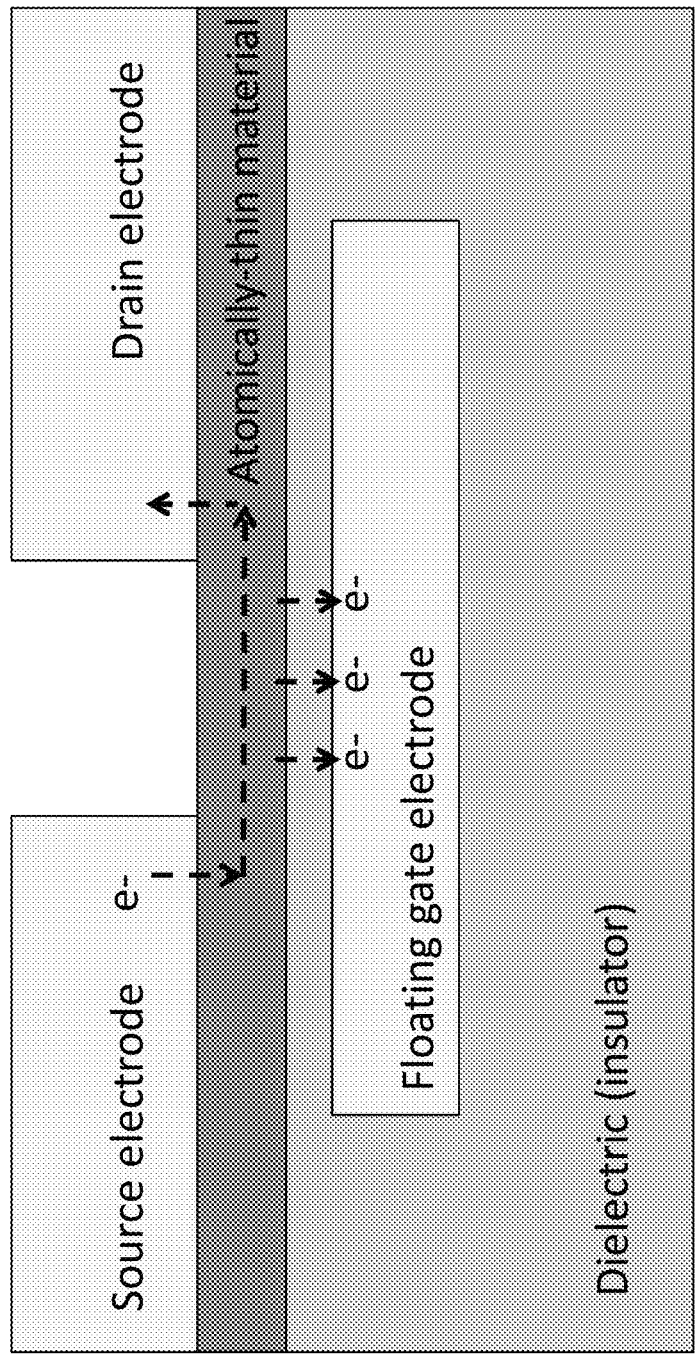
FIG. 8b shows a similar device as FIG. 8a, with a floating gate that stores the charge, instead of the dielectric traps.
Figure 8C:
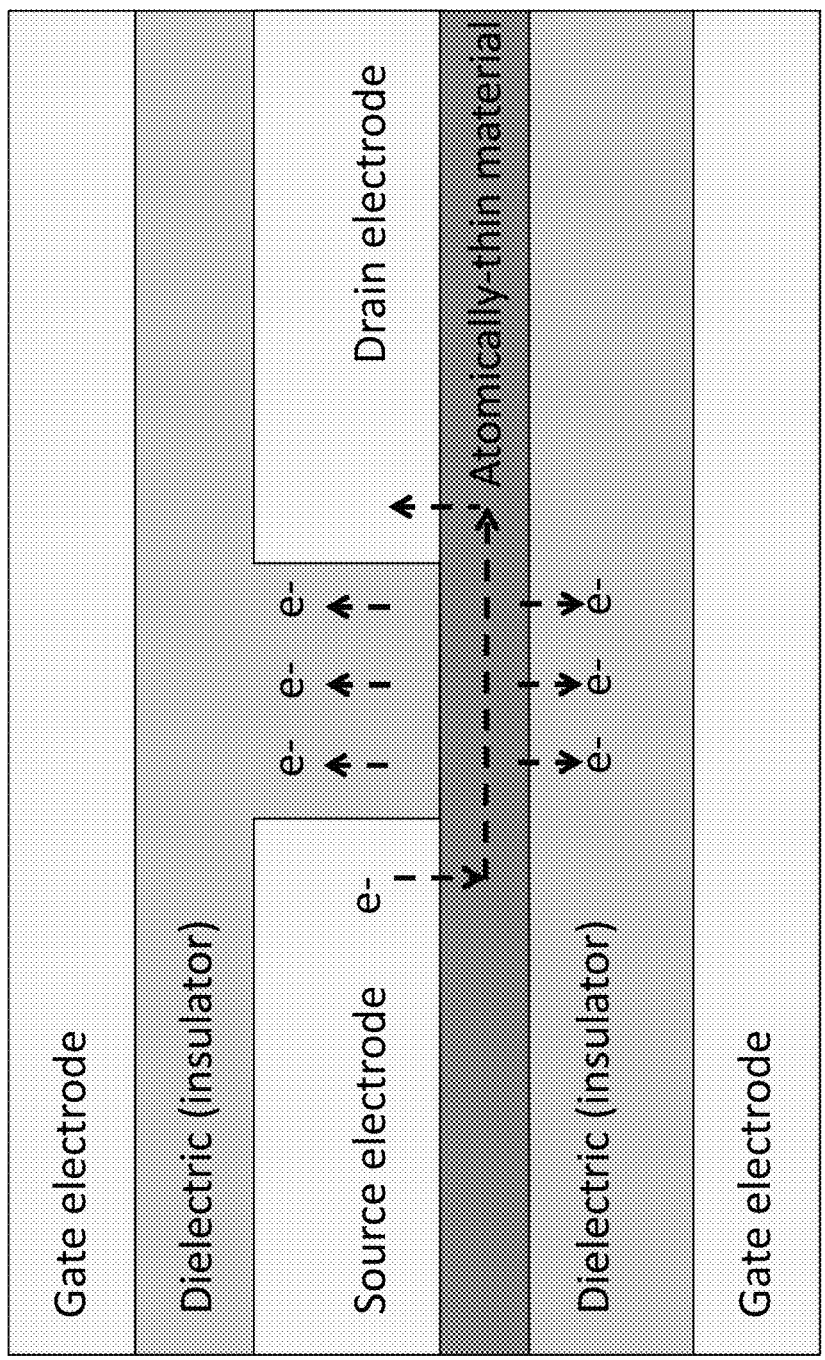
FIG. 8c shows the same as FIG. 8a but with another top gate electrode for improved control.

As set forth in FIG. 8, control within the device is achieved with a bottom gate and a dielectric that stores the charge in traps. Electron transport through the atomically-thin material is ballistic that can be nonlinear. This nonlinearity is expected to show negative differential resistance (NDR), upon tuning of the materials used. NDR itself is expected to be of use for high-speed switching and amplification applications. Other embodiments are depicted in FIGS. 12b and 12c, with 12b featuring a floating gate within a dielectric that stores the charge instead of the dielectric traps as set forth in 12a, and in 12c with another top gate electrode providing further improved control.

Figure 1A:
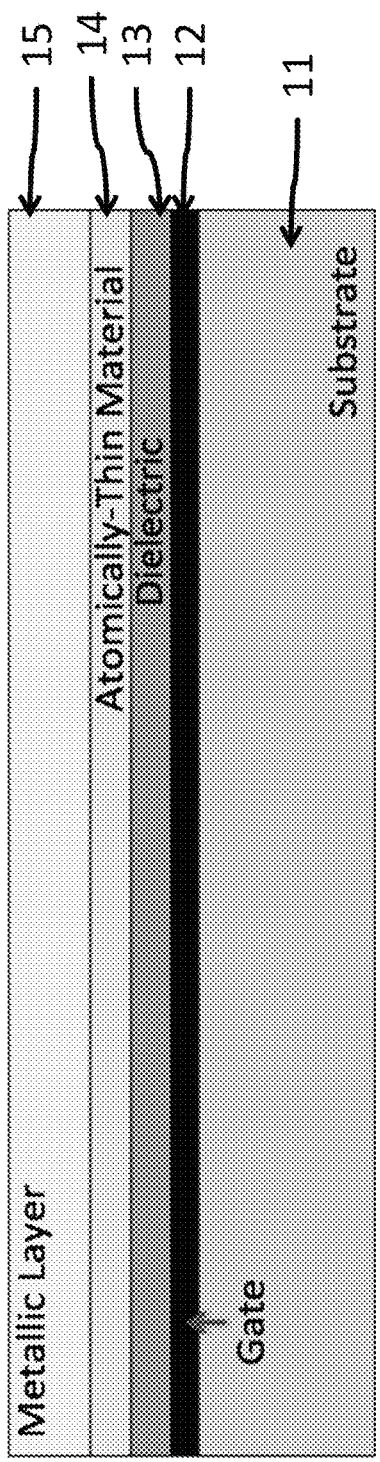
FIG. 1a shows a metallic layer deposited onto an atomically-thin material, which is separated from a gate electrode by a dielectric. Alternatively, a floating gate electrode can be embedded within the dielectric layer.
Figure 1B:
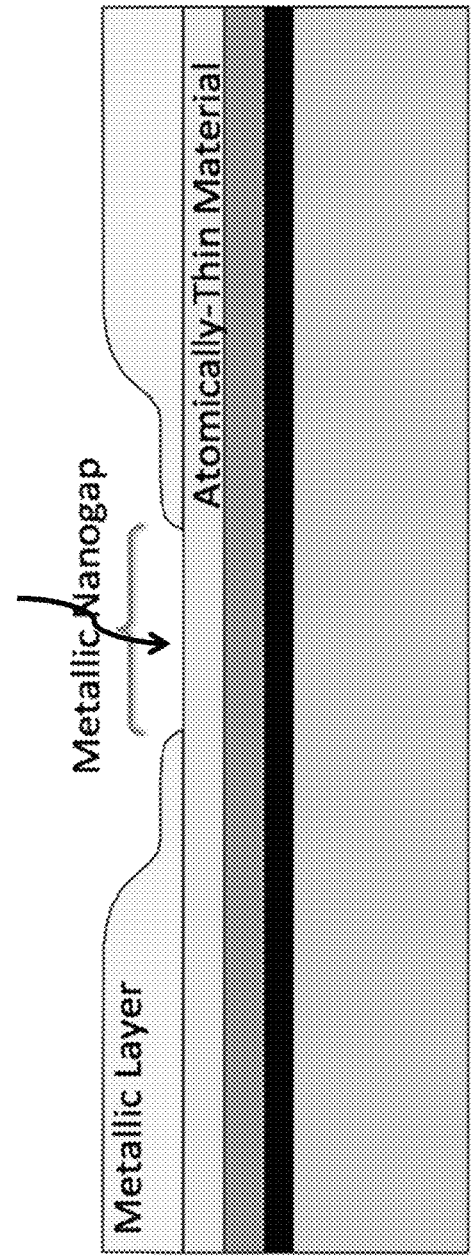
FIG. 1b shows a nanogap can be opened up in the metallic layer. This can be achieved through electromigration (as we have demonstrated), etching, or through direct deposition.
Figure 2B:
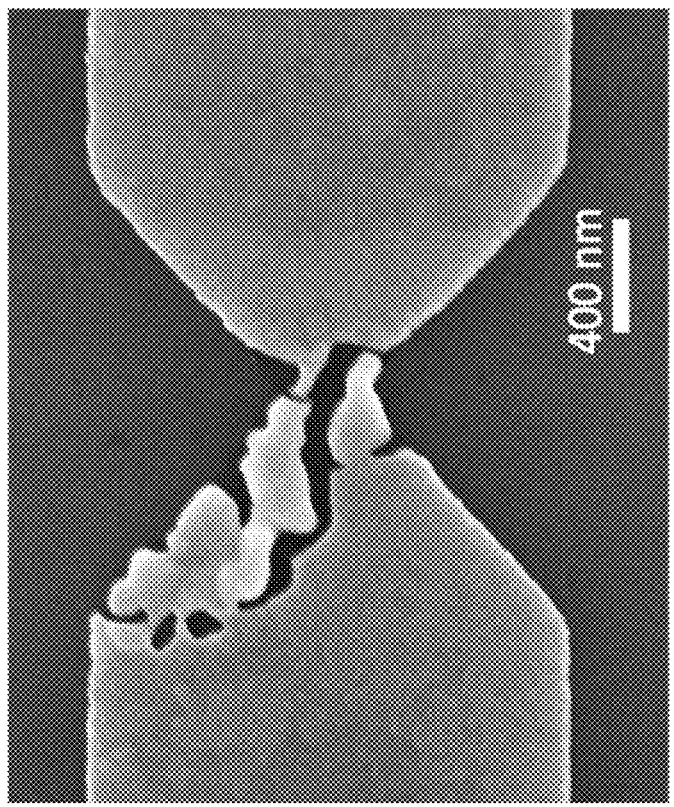
FIG. 2b shows a scanning electron microscope image of gold nanogaps on graphene. The lightest regions are the gold electrodes.
Figure 2A:
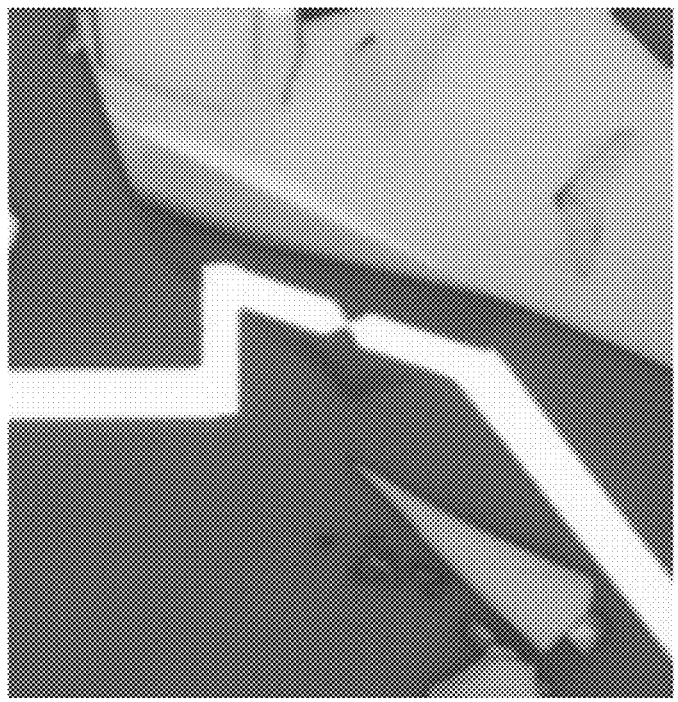
FIG. 2a shows optical image of gold wire deposited onto a graphene film.

FIG. 1 shows a further schematic illustration of the design of a metallic nanogap on an atomically-thin material. A metallic nanogap can be achieved through various routes. The illustration in FIG. 1 shows a high-yield method to achieve such a nanogap. First, an atomically-thin material placed onto a dielectric layer, which separates it from an underlying gate electrode. A continuous metal layer is then placed on top of the atomic layer by (for example) deposition by an evaporator, as in FIG. 1a. Etching is then used to remove exposed channel material. After this step, an electric current is driven through the metal and it is controllably electromigrated open until it forms a nanogap within the metal, as illustrated in FIG. 1b. This processing results in a closely spaced source-drain electrode pair which are directly located onto an atomically-thin channel material. FIG. 2a shows an exemplary optical image of a gold lead metallic layer placed onto a monolayer atomically-thin graphene film. FIG. 2b shows the resulting metallic nanogap situated on graphene after electromigration of the gold lead. Graphene is visible under the regions where the gold wire has been removed through electromigration.

Figure 3B:
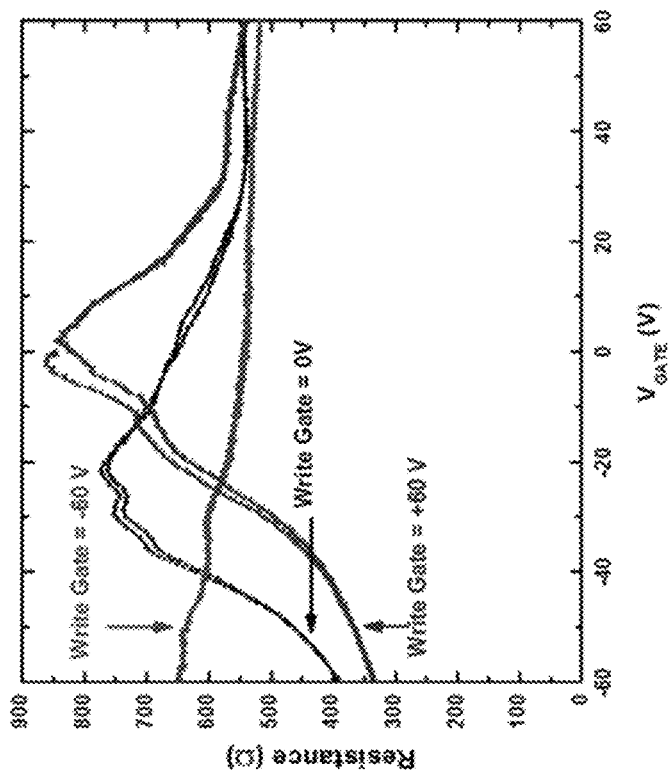
FIG. 3b shows this charge state can easily be read with a low bias voltage (less 40 mV), as demonstrated by the Write gate curve at −60V. Performing similar 1.0 V bias write operations with the gate fixed at 0.0 V and +60.0 V results in different charge states.
Figure 3A:
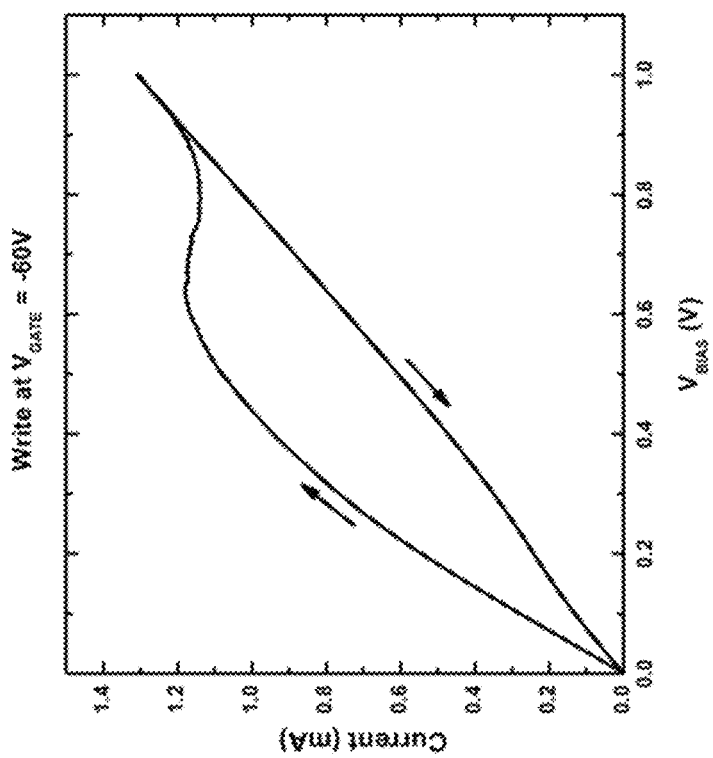
FIG. 3a shows a high-bias ramp across a nanogap situated on a graphene film. At voltages greater than 0.6 V with the back-gate kept at a fixed −60.0 V, the system switches into a different charge state.

A metallic nanogap on an atomically-thin layer (MNATL) can control the charge injection into the gate dielectric or alternatively a floating gate electrode. This permits separate READ and WRITE operations of the device making it suitable as a non-volatile memory element. This is demonstrated in FIG. 3a showing current measurements during a high bias ramp across a nanogap located on a graphene film. During the ramp upwards the conductivity is high, but upon passing above 0.6 volts the conductance decreases due to induced charge exchange with the nearby supporting dielectric (which is denoted as the WRITE operation). This lower state of conductance persists upon lowering the applied bias voltage along the lower curve. The low bias conductance of the device measured (which is denoted as the READ operation) at a bias voltage less than 40 mV as a function of gate voltage is shown in FIG. 3b. The highest resistance state of the metallic-nanogap-graphene device is located at the lowest applied gate voltages. FIG. 3b also demonstrates that at low applied bias there is minimal hysteresis. When the bias is ramped up to 1.0 V for zero applied gate voltage, the gate dependence changes to the black curve in FIG. 3b—again having minimal hysteresis. Likewise, when the bias is increased beyond 1.0 V for a gate of 60.0 V the gate response changes to the blue curve in FIG. 3b where the maximum resistance is approximately zero volts.

The fact that the low bias (READ) measurements do not affect the charge state of the device indicates that they only act to probe the system. Since the WRITE operation is only activated upon application of a high bias, a single gate electrode can control many of these devices in parallel. Moreover, the device can be charged to many different distinguishable states which makes it of use for multi-bit storage.

The close proximity of the metallic electrodes to the channel makes them highly "intrusive". These highly intrusive electrodes manifest themselves in a highly asymmetric gate dependence about the maximum resistance (see curves in FIG. 3b). This highly asymmetric gate response is particularly useful for helping to resolving the state (bit) of the device.

Ultra-short devices that incorporate atomically-thin components have the potential to be the smallest electronics. Such extremely-scaled atomically-thin devices are expected to show ballistic nonlinear behavior that could make them of tremendous use for ultra-fast applications. While nonlinear diffusive electron transport has been widely reported, clear evidence for intrinsic nonlinear ballistic transport in the growing array of atomically-thin conductors has so far been elusive. Here we demonstrate, as an example, nonlinear electron transport of an ultra-short single-layer graphene channel that shows quantitative agreement with intrinsic ballistic transport. This behavior is shown to be distinctly different to that observed in similarly prepared ultra-short devices consisting, instead, of bilayer graphene channels. These results suggest that the addition of only one extra layer of an atomically-thin material can make a significant impact on the nonlinear ballistic behavior of ultra-short devices, which is possibly due to the very different chiral tunneling of their charge carriers. The fact that we observe the nonlinear ballistic response at room temperature, with zero applied magnetic field, in non-UHV conditions, and directly on a readily accessible oxide substrate makes the nanogap technology we utilize of great potential for achieving extremely scaled high-speed atomically-thin devices.

The present invention provides in part for methods of introducing a metallic nanogap on graphene devices. Graphene devices may initially be isolated on a substrate, such as highly p-doped silicon substrates with 300 nm of thermally grown $SiO_2$. To eliminate any environmental doping effects, the substrates may be cleaned in a dry $N_2$ environment prior to device construction. Graphene flakes may then be optically identified with the thickness confirmed by (for example) Raman microscopy.

Lithography may be used to create a metallic locally-thinned or bowtie geometry on top of graphene or other atomically-thin material. This constriction geometry ensures the nanogap formed at a later stage is on top of the atomically-thin material. Metal electrodes may be fabricated by depositing metal of about 30 nm in thickness. The excess atomically-thin material not covered by metal may then be etched using plasma in a reactive-ion etcher where the metal electrodes themselves act as an etch mask. The feedback controlled electromigration (FCE) process can be performed in order to produce the metallic nanogaps. Both the FCE process and electrical characterization may be carried out in a cryogenic probe station under vacuum, thereby avoiding ambient air contamination of the device.

FCE may be performed by ramping the bias voltage ($V_b$) across the constricted metal electrodes while monitoring the current. When the two-probe resistance of the entire structure increases by a small ~2% change, a computer controlled voltage source ramps down $V_b$ by approximately 20% in order to arrest the electromigration of the metal. After this, the $V_b$ may be ramped up again until another ~2% change is measured, and then ramped downward to arrest the electromigration. This procedure can be then continued until the metallic nanogap is completely formed over the graphene.

In devices where the gate electrodes are spaced from the channel at a distance similar to the nanogap size, the applied bias can induce the charging of the dielectric traps and the floating gates. This acts to combine the READ and WRITE operations discussed above into a single operation controlled by the applied bias. This permits these high-speed nonvolatile devices to act as a atomically-thin memristors.

EXAMPLES

Here we show quantitative experimental evidence for intrinsic nonlinearity resulting from ballistic conduction due to a variation of the density of modes in an ultra-short channel of graphene. This behavior is shown to be distinctly different to that observed in similarly prepared ultra-short devices consisting of bilayer graphene channels. These results suggest that the addition of only one extra layer of an atomically-thin material can make a significant impact on the nonlinear ballistic behavior of ultra-short devices, which are possibly due to the very different chiral tunneling of their charge carriers (Katsnelson et al. *Nat. Phys.* 2006, 2 (9), 620-625). We find that the nonlinear ballistic transport persists up to room temperature even while situated on a readily accessible $SiO_2$ substrate, making it achievable in technologically-relevant environments. Although ballistic transport has previously been reported in graphene, such behavior typical requires very low-temperatures, suspended samples, or specially designed substrates (Du et al. *Nat. Nanotechnol.* 2008, 3 (8), 491-495; Bolotin et al. *Solid State Commun.* 2008, 146 (9-10), 351-355; Qi et al. *ACS Nano* 2015, 9 (4), 3510-3520; Mayorov et al. *Nano Letters* 2011, 11 (6), 2396-2399; Miao et al. *Science* 2007, 317, 1530-1533; Tombros et al. *Nat. Phys.* 2011, 7 (9), 697-700; Baringhaus et al. *Nature* 2014, 506 (7488), 349-354). Moreover, ballistic behavior on a common oxide (like $SiO_2$) at technologically useful ambient temperatures is not typically clearly distinguishable, even for channels as short as 50 nm in length (Wu et al. *Nano Letters* 2012, 12 (3), 1417-1423).

Figure 4A:
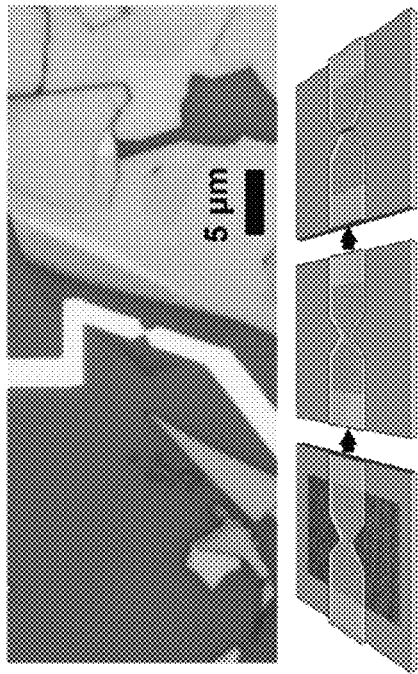
FIG. 4a shows a schematic illustration of an ultra-short channel GFET.

To achieve the ultra-short GFETs, as illustrated in FIG. 4a, we utilize a metallic nanogap break junction positioned over either single-layer or bi-layer graphene. Such metallic nanogaps have been extensively used over the last two decades to investigate electrical conduction through single molecules and atoms (van der Molen et al. *J. Phys.-Condes. Matter* 2010, 22 (13)). To achieve the GFET structure on a solid substrate backed with a gate electrode as in FIG. 4a, we utilize a break junction formed through an electromigrated metallic nanogap situated on top of the single-layer and bi-layer graphene (Strachan et al. *Appl. Phys. Lett.* 2005, 86, 043109; Park et al. *Appl. Phys. Lett.* 1999, 75, 301-303; Lu et al. *Small* 2010, 6 (23), 2748-2754). To avoid excessive heat dissipation and thermal runaway during device formation, which can damage the underlying graphene layers, we utilize feedback controlled electromigration (FCE) (Strachan et al. *Appl. Phys. Lett.* 2005, 86, 043109; Hunley et al. *J. Appl. Phys.* 2013, 113 (23), 234306-7; Esen et al. *Appl Phys Lett* 2005, 87 (26), 263101). FCE has been shown to result in clean nanogaps with well-defined metallic interfaces that can be simultaneously fabricated in parallel (Strachan et al. *Phys. Rev. Lett.* 2008, 100, 056805; Johnston et al. *Nano Lett.* 2007, 7, 2774-2777; Ward et al. *Nano Lett.* 2007, 7, 1396-1400; Johnson et al. *IEEE Trans. Nano.* 2010, 10 (4), 806-809). In the work we present here, the careful monitoring of the device evolution using FCE is critical to avoid damaging the underlying graphene, as large applied current densities and electric fields have previously been shown to breakdown these atomically-thin films (Standley et al. *Nano Letters* 2008, 8 (10), 3345-3349; Prins et al. *Nano Letters* 2011, 11 (11), 4607-4611; Shi et al. *Nano Letters* 2011, 11 (4), 1814-1818; Moser et al. *Appl Phys Lett* 2009, 95 (17), 173506-3).

Figure 4B:
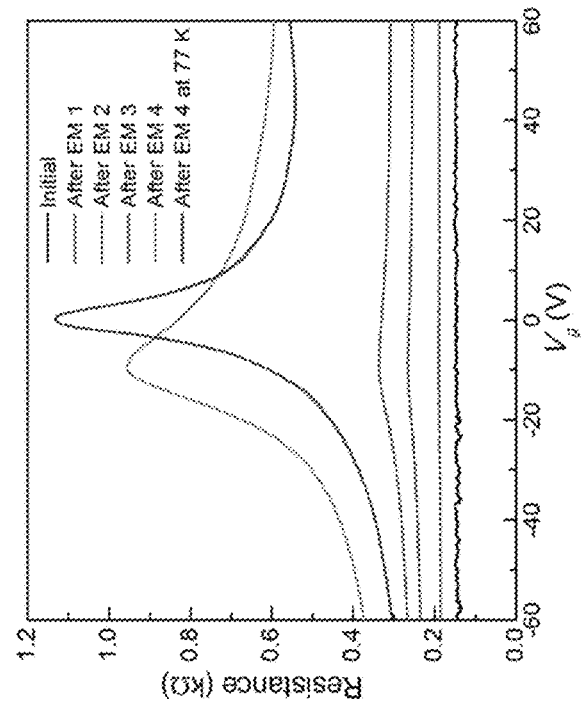
FIG. 4b shows an optical image of a Au metallic wire with a narrow (approximately 450 nm wide) constriction lithographically deposited onto the surface of a single layer of graphene. As outlined schematically below the image, the exposed graphene is etched away and a nanogap is formed using feedback controlled electromigration (FCE).
Figure 4C:
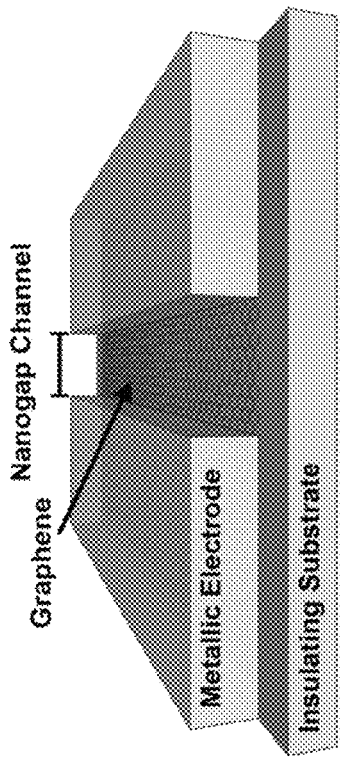
FIG. 4c shows I–$V_b$ characteristics during FCE formation of the metallic nanogap on graphene.
Figure 4D:
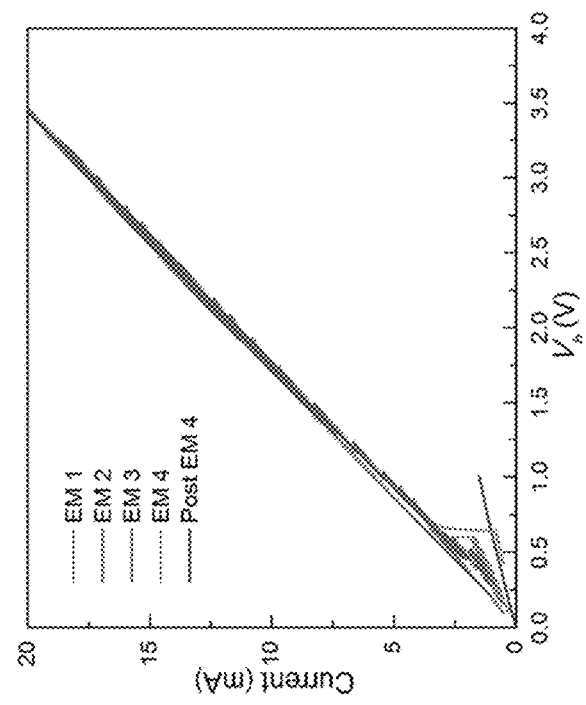
FIG. 4d shows field effect of the device at various stages of the FCE shown in FIG. 4c.

The construction of the ultra-short channel GFET consists of the three-step process schematically outlined in FIG. 4b. First, a 30 nm thick Au nanowire with a narrow constriction is lithographically evaporated on top of exfoliated single-layer or bi-layer graphene, as shown in the optical image of a typical device in FIG. 4b. The sample is then plasma etched to remove exposed graphene, followed finally by application of FCE to produce a nanogap bridged only by the graphene in the vicinity of the constriction. FCE is performed by utilizing a sequence of voltage bias ($V_b$) ramps that slowly opens up a nanogap, as shown in FIG. 4c for the construction of a single-layer GFET device (Strachan et al. *Appl. Phys. Lett.* 2005, 86, 043109). We monitor the progress of the nanogap graphene channel at various stages by investigating its electric field effect with a gate electrode, as shown in FIG. 4d for this single-layer sample. Initially, the structure shows negligible response as a function of gate voltage ($V_g$), but as FCE proceeds field effect becomes discernable indicating that the current is increasingly passing through the underlying graphene. Once the peak resistance of the device reaches about 800Ω, the two-probe conductance of the device shows increased stability. At this stage, the gate dependence of the low-bias conductance is qualitatively similar to the behavior of a long-channel GFET device—where a high resistance peak is observed. This behavior indicates that a metallic nanogap has fully opened and is bridged only by the underlying graphene channel. This is confirmed by a scanning electron microscope (SEM) image (taken after all the electrical measurements discussed below have been performed) in FIG. 4e, which shows a nanogap between two Au electrodes on the single-layer graphene.

Figure 4F:
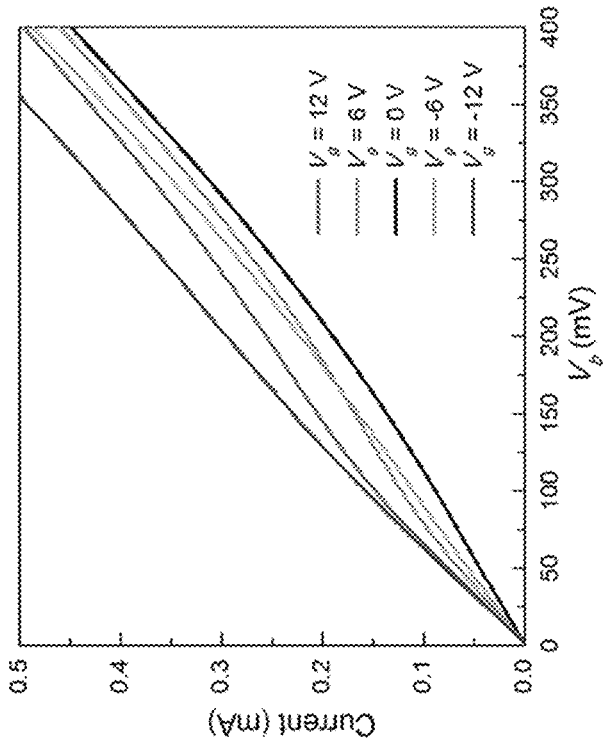
FIG. 4f shows nonlinear current versus applied $V_b$ of the ultra-short GFET.
Figure 4E:
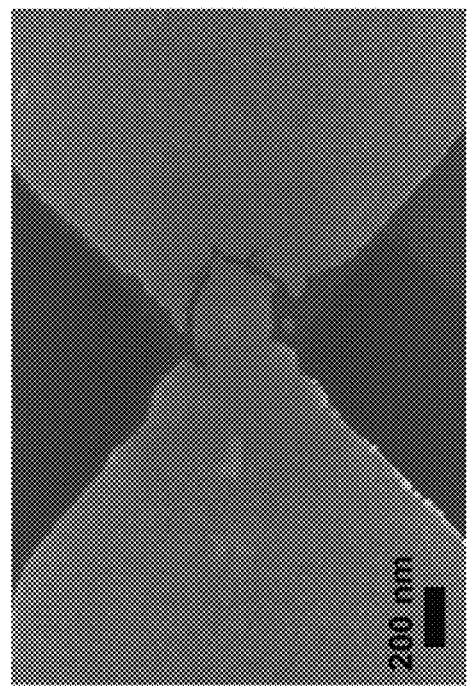
FIG. 4e shows a scanning electron microscope image of the resulting nanogap after FCE and the electrical measurements have been performed.

While the low-bias behavior of the single-layer device in FIG. 4d resembles that of a long-channel GFET, the high-bias regime shows significant nonlinear deviations where the gate dependence diminishes, as seen in the I–$V_b$ curves in FIG. 4f. This is clearly observed by looking at the differential conductance as a function of $V_b$, shown in FIG. 5a at 77 K. This plot shows a low-bias conductance peak with significant gate dependence, whereas at higher biases the differential conductance loses its field effect. That is, these curves have low and high bias behaviors that are separated by a low differential-conductance 'quasi-saturation' regime. The complete behavior of this nonlinear response as a function of gate and bias voltages can be investigated through differential conductance maps for both the 77 K (FIG. 5b) and room temperature (FIG. 5c) measurements. These differential conductance maps show that the quasi-saturation point, denoted as the value of $V_b$ where the minimum in the differential conductance occurs, is symmetrically positioned about zero-bias and increases as the graphene channel is tuned away from it neutrality point.

Similar ultra-short devices consisting, instead, of bi-layer graphene show distinctly different nonlinear behavior, as seen in the differential conductance map of one such device in FIG. 5d. In the bi-layer case, the prominent zero-bias conductance peak observed for single-layer devices is replaced by nonlinearities that more closely resemble the behavior of a conventional tunnel junction, where $\partial I/\partial V_b$ increases as the bias voltage and (thus) the tunnel barrier is tilted (Simmons et al. *J. Appl. Phys.* 1963, 34 (6), 1793-&). We have, to date, measured in detail four nanogap GFETs, which include two single-layer and two bi-layer devices. Our measurements indicate that the addition of a single atomically-thin graphene layer (in going from one to two layers) makes a significant reproducible impact on the nonlinear behavior of these ultra-short devices. In the following discussion, we will focus on the behavior of one of the single-layer devices (the one shown in FIG. 4, FIG. 5b, and FIG. 5c) and show that the nonlinearities can be quantitatively described by an analytical model for an ultra-short ballistic graphene channel.

Figure 6A:
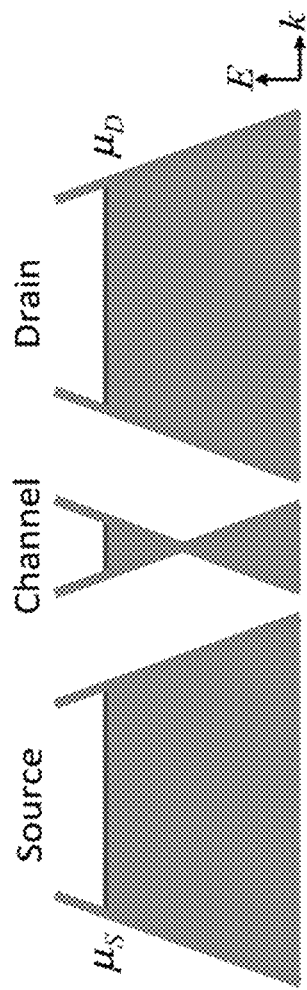
FIG. 6a shows a schematic of the three components of the ultra-short GFET. The source and drain are p-doped due to the overlapping metal, while the channel's charge is determined by the underlying gate electrode. For a positive gate voltage states are filled in the channel while the source and drain are held relatively constant by the metal.
Figure 6B:
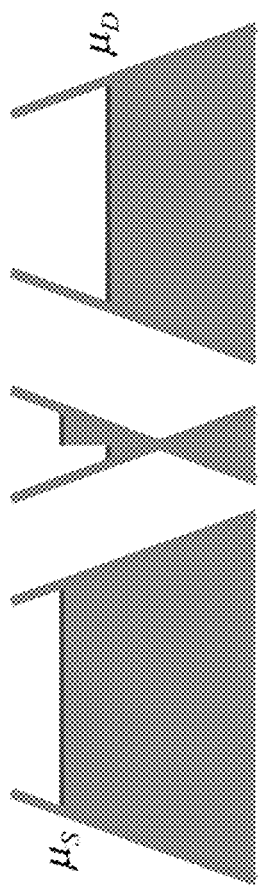
FIG. 6b shows that for positive applied bias voltage, and with a fixed gate voltage, the drain Fermi-level is lowered such that the states on the channel keep the charge density approximately constant in the channel.
Figure 6C:
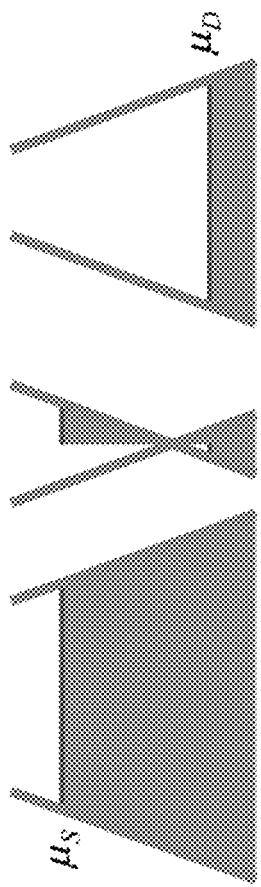
FIG. 6c shows that when the drain Fermi-level passes the neutrality point of the channel, as shown in this illustration, the model predicts an inflection point in the I–$V_b$ behavior.

The observed transport characteristics of a single-layer device can be understood using the intrinsic ultra-short channel GFET ballistic model illustrated in FIG. 3 (Grassi et al. *IEEE Trans. Electron Devices* 2013, 60 (1), 140-146). This intrinsic ballistic model ignores phase coherent effects, such as Fabry-Perot interference, that are not clearly discernable in our measurements. In the intrinsic ballistic model we use, the graphene below the two metal electrodes acts as the source and drain to the device, with the channel consisting of the nanoscale graphene segment located in the nanogap between them. These different regions are represented by the three linear graphene dispersion relations in FIG. 6a. Due to the doping of the graphene under the metallic electrodes, the Fermi levels in the source and drain are offset from the neutrality point, as is depicted in FIG. 6a (Giovannetti et al. *Phys. Rev. Lett.* 2008, 101 (2)). By applying a positive gate voltage the Fermi level in the channel is increased in relation to the neutrality point, as depicted in FIG. 6a. The transport of such a system is specified by Landauer conduction and is determined by the minimum number of transverse modes at each relevant energy in either the source, drain, or channel We assume that the metallic doping of the source and drain regions is large enough such that the channel always has the minimum number of transverse modes at all relevant energies for our experiments between the source and drain Fermi levels, $\mu_S$ and $\mu_D$, which permits an analytic solution as a function of $V_g$ and $V_b$. In this intrinsic model, when the drain voltage is increased (in going from FIG. 6a to FIG. 6b) while keeping $V_g$ fixed, rightward going electron states are increased in the channel at the expense of leftward going states such that the total charge is kept approximately constant. The overall current, for a fixed source-drain bias voltage, is then given by the integrated number of modes between the source and drain Fermi levels. When the drain Fermi level is decreased to the point that it crosses the neutrality point of the channel the model predicts an inflection in the I–$V_b$ behavior, as is seen in the measurements in FIG. 5. The symmetry with respect to the source-drain voltage in the data can be understood through the ballistic model as arising from the oppositely applied $V_b$ causing the channel's neutrality point to pass the Fermi-level of the source. At larger source-drain biases the neutrality point is located between the source and drain Fermi levels (such as in FIG. 6c). In this high-bias regime, the total current is relatively insensitive to the position of the neutrality point of the channel and diminished gate response beyond the inflection point is expected, in agreement with the data in FIGS. 5a-c.

Figure 6D:
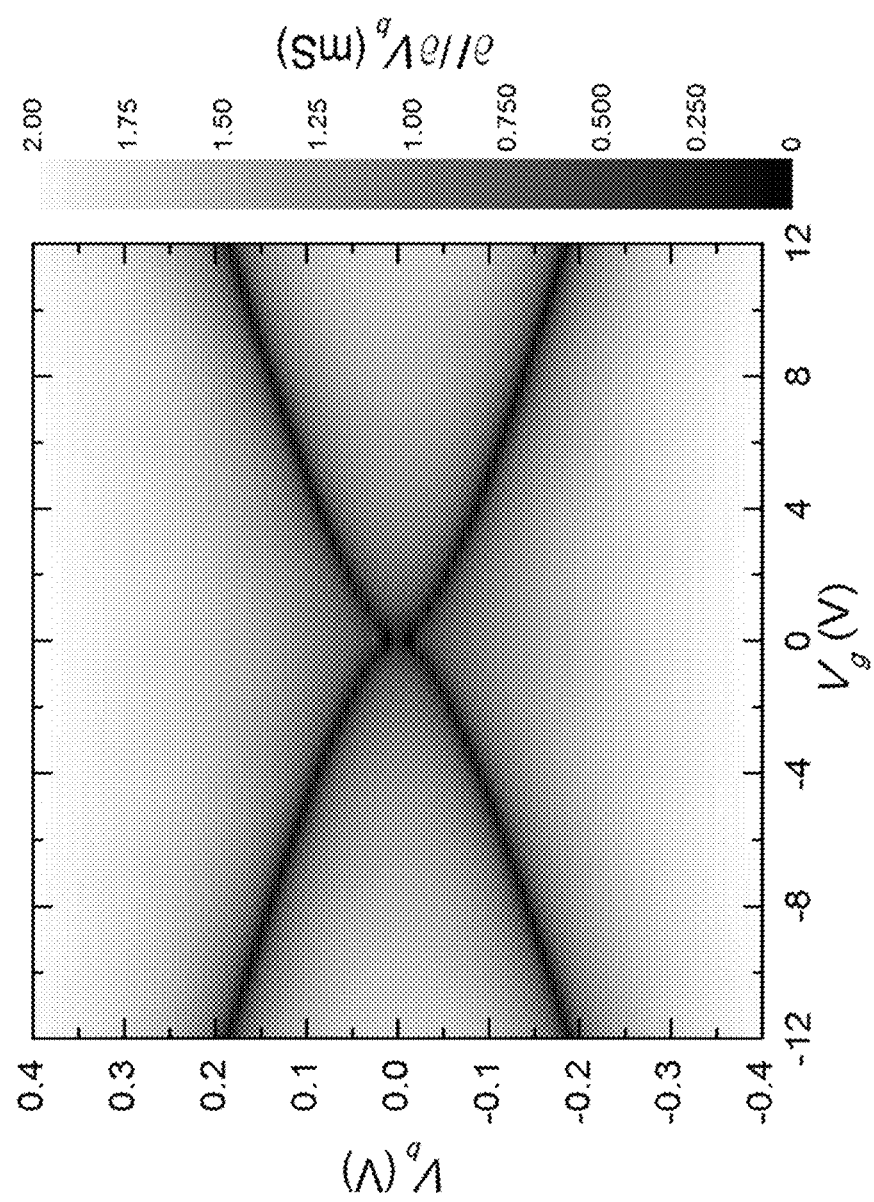
FIG. 6d shows calculated conductance map according to the ballistic model with an additional series resistor of $R_S$=350Ω.

FIG. 6d shows the calculated differential conductance map of the ballistic model as a function of bias and gate voltages. In addition to the linear dispersion of graphene, there are only three input parameters to the model—two specified by well-determined geometrical aspects of the device while a third does not affect the nonlinear response. The first parameter is the transverse width of the device, which is directly measured to be 600±40 nm using the image of the nanogap in FIG. 4e. The exact length of the nanogap (i.e., the distance between the Au electrodes) appears to vary predominantly on the 10-20 nm scale over the width of the nanogap, consistent with previous reports of higher-resolution imaging of electromigrated nanogaps formed at room temperature (Strachan et al. *Nano Lett.* 2006, 6, 441-444). Although the precise nanogap length is not clearly discernable in our SEM imaging, its value does not enter into the intrinsic ballistic behavior as long as it is short enough to maintain ballistic transport of the carriers.

The second required parameter is the gate-channel coupling which is directly given by the planar parallel plate value of $C_{ox}$=0.115 fF/μm² for the 300 nm SiO$_2$ thickness used in our experiments. While sufficient gate coupling can be difficult to achieve in metallic nanogap devices, we expect significant coupling over the entire width of our nanogap GFET due to the non-zero density of states in graphene and the fact that the channel is located on the same side as the gate electrode and should not be strongly screened (Datta et al. *Phys. Rev. B* 2009, 79, 205404). Supporting this view, a minimum nanogap length of ~0.36 nm required to achieve effective gate coupling can be estimated using the relevant density of states for graphene. Since the nanogap channel should be more than an order of magnitude larger than this, we should be justified in utilizing the planar capacitance model with minimal variation of the capacitive coupling over its width due to changes in the gap length.

In addition, the overall doping level of the nanogap channel should not affect the calculated response, apart from an overall shift in FIG. 6d along its horizontal gate axis. For our model calculation, we assume that the channel does not have an overall offset doping level, which is consistent with our measurements in FIG. 5b and reported ab initio calculations (Barraza-Lopez et al. *Phys. Rev. Lett.* 2010, 104 (7), 4). Although other calculations of a single thick electrode, in the vicinity of a gate, suggests that it could cause graphene to be strongly doped over long distances; the actual doping is expected to be highly dependent on the overall geometry of the device (Khomyakov et al. *Physical Review B* 2010, 82 (11), 115437). Specifically, ab initio computations of nanogap metallic electrode pairs with nanoscale thickness, which are more relevant to our geometries, have found that doping only persists a few nanometers away from the electrode edges into the graphene channel, and that the CNP of a ~10 nm long channel corresponds very closely to zero net doping when it is not in the immediate vicinity of a gate (Barraza-Lopez et al. *Phys. Rev. Lett.* 2010, 104 (7), 4). Thus, the non-doped nanogap channel we model is consistent with the thinned electrodes that result from FCE-formed metallic nanogaps (Strachan et al. *Phys. Rev. Lett.* 2008, 100, 056805).

The final input parameter to the model is an effective series resistor $R_S$ (chosen as 350Ω for the calculations in FIG. 6d) that accounts for dissipation in the metal wire and scattering at the channel interfaces, but which does not contribute to the nonlinear behavior measured. While the value of $R_S$ is expected to depend on the gate voltage (as discussed in section 6.2 of the Supporting Information), a qualitative understanding of the differential conductance maps in FIG. 5b and FIG. 5c can be obtained through the use of a representative constant value for $R_S$ of 350Ω.

The results of the calculation using these parameters is shown in FIG. 6d, which reproduces the salient features of the experimental data in FIGS. 2a-c. Both show quasi-saturation that is symmetric with respect to $V_b$ at increasing biases as $V_g$ is increased. Moreover, like the experimental data, the calculated model reproduces the gate tunable zero-bias conductance peak experimentally measured in FIGS. 5a-c. While the high-bias ballistic quasi-saturation model reproduces the principal features of our ultra-short GFET, it neglects energy broadening, which is apparent in the experiments in that the differential conductance dip is not as sharp at the inflection point as it is for the theory (Grassi et al. *IEEE Trans. Electron Devices* 2013, 60 (1), 140-146; Zhao et al. *IEEE Trans. Electron Devices* 2011, 58 (9), 3170-3178). Away from the inflection point, it is expected that the effects of energy broadening should be minimal,[7] and in this regime the nonlinear transport measurements can be quantitatively and unambiguously compared to the ballistic transport model, as follows.

Figure 7A:
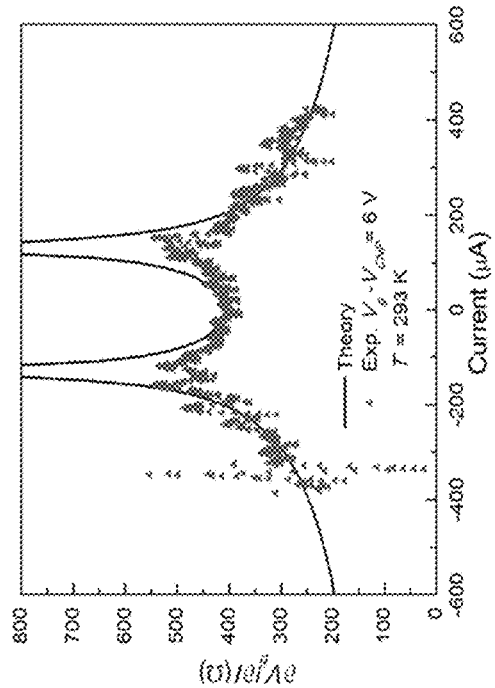
FIGS. 7a to 7f show $\partial V_b/\partial I$ for the ballistic theory (solid lines) plotted against the experimentally determined values for measurements at 77 K (squares) and room temperature (triangles) with a series resistance ($R_S$) subtracted off and plotted in FIG. 7g.
Figure 7B:
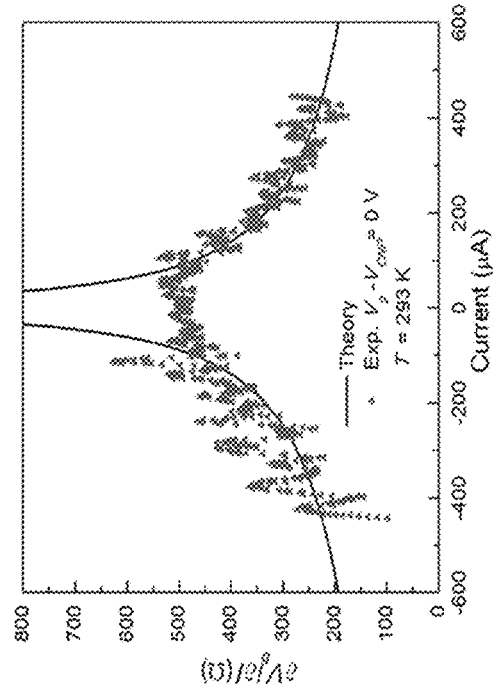
Figure 7C:
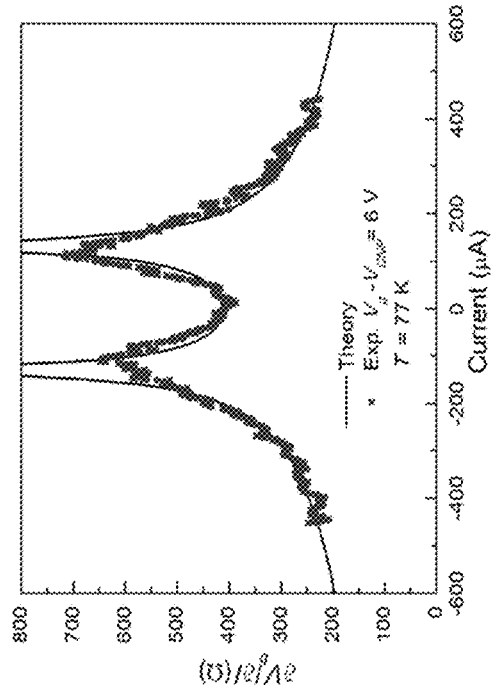
Figure 7D:
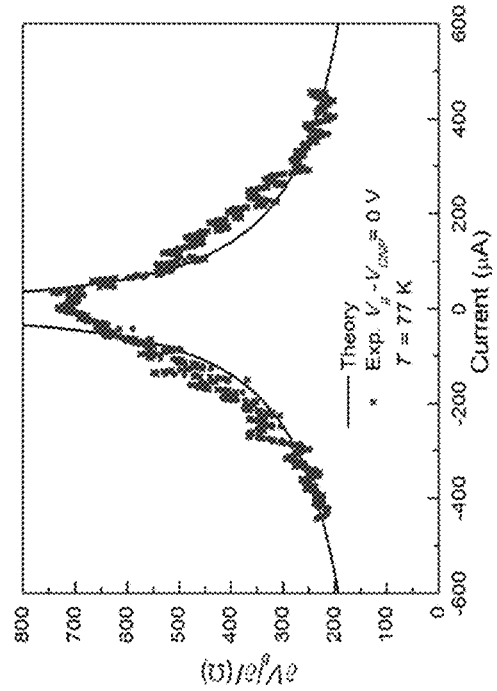
Figure 7E:
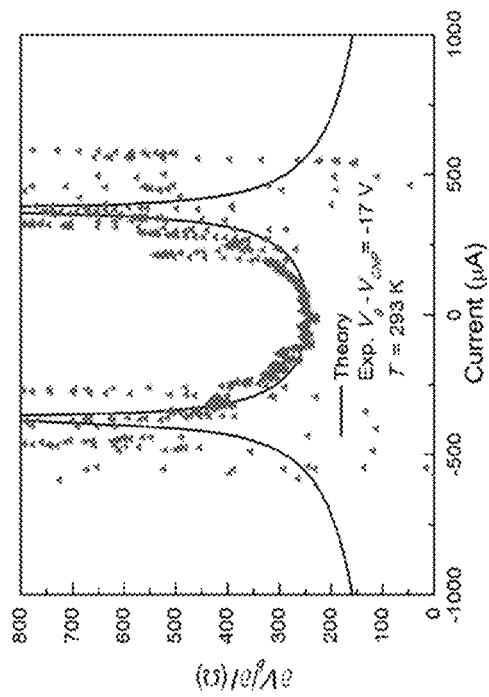
Figure 7F:
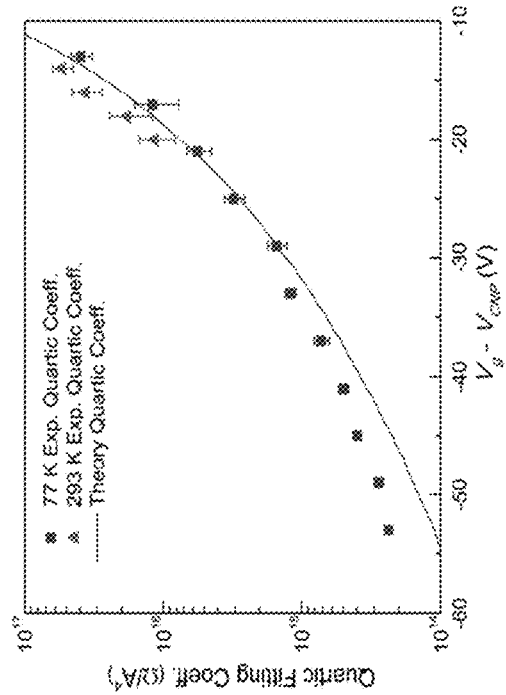

To quantitatively compare the nonlinear transport measurements to the ballistic model, we investigate $\partial V_b/\partial I = R_S(T, V_g) + R_L(V_g) + R_{NL}(V_g, I)$, where $R_L$ is the low-bias linear ballistic resistance, and $R_{NL}$ contains all the nonlinearities due to ballistic transport. Since the voltage drops across the nonlinear channel and the effective series resistance should add up to the total applied $V_b$, this analysis allows us to quantitatively compare the nonlinearities observed with those from the intrinsic ballistic model, without requiring prior knowledge of the value of $R_S$. To achieve this quantitative comparison, we compute $\partial V_b/\partial I$ from the measurements and subtract a constant resistance such that the data match the expected low-bias linear ballistic behavior. The results of this analysis for the 77 K data, at a $V_g$ relative to the charge neutrality point of the channel ($V_{CNP}$) given by $V_g - V_{CNP}$=6 V, are plotted in FIG. 7a and show excellent agreement with the computed ballistic nonlinearities. Moreover, the room temperature data also show excellent agreement with the same nonlinear ballistic model, as seen in FIG. 7b, with just slightly increased broadening apparent in the vicinity of the inflection points. In the vicinity of the charge neutrality point of the channel (i.e., when $|V_g - V_{CNP}| \lesssim 4V$) the broadening obscures the minimum in $\partial V_b/\partial I$; however, we find that a $R_S$ can still be subtracted from the measurements making it apparent that the high-bias nonlinearities show excellent agreement with the ballistic theory at both 77 K and room temperature, as is seen in FIGS. 7c and 7d. The excellent agreement between the measured nonlinearities and the ballistic theory within the inflection points persists to negative gate voltages down to ~−40 V. FIGS. 7e and 7f show the excellent agreement within the inflection points at $V_g - V_{CNP}$=−17 V for both 77 K and room temperature.

Figure 7G:
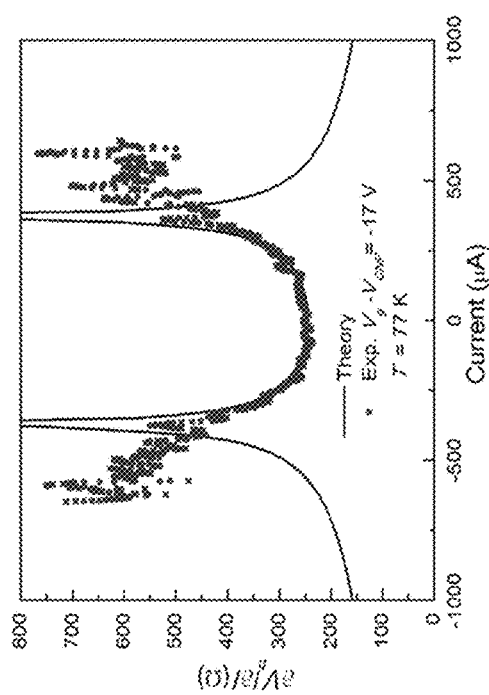
FIG. 7 shows quantitative comparison between nonlinear response of ultra-short GFET and the ballistic theory.
FIG. 7h shows comparison between theory and experiment of the nonlinear quartic fitting coefficient determined within the inflection points for $V_g$-$V_{CNP}$<10V.

The subtracted $R_S$ determined over an extended range of $V_g$ in the above analysis is shown in FIG. 7g. The gate dependence of this series resistance can be understood to arise from scattering that might be expected to arise from channel interfaces that are not perfectly parallel. An estimate of the gate-dependence of the series resistance can be obtained by assuming this additional diffusive scattering is consistent with Matthiessen's rule and given by the Boltzmann transport resistance of graphene. Using the channel length as the mean free path in the Boltzmann resistance, in addition to the series resistance of the Au lead at 77 K, results in the solid curve shown in FIG. 7g, which agrees with the experimentally observed gate-dependent rise of $R_S$ as the device is tuned near its CNP.

The agreement between the measured nonlinearities and those of the intrinsic ballistic model demonstrates the important role that Klein tunneling can play in ultra-short GFETs. The ballistic model is based on the assumption that the electrons pass through the source-channel and drain-channel interfaces with near perfect transmission (Grassi et al. *IEEE Trans. Electron Devices* 2013, 60 (1), 140-146). This near perfect transmission is a unique feature of chiral tunneling of massless carriers (known as Klein tunneling) incident perpendicularly to energy barriers, as is expected for graphene when the channel is tuned near its neutrality point (Katsnelson et al. *Nat. Phys.* 2006, 2 (9), 620-625).

The unique features of chiral tunneling could also be the source of the distinctly different nonlinear behavior of ultra-short bi-layer graphene, as seen in the FIG. 5d. In bi-layer devices the chiral tunneling should be described by an exponentially decaying transmission as a function of channel length, much like conventional quantum tunneling through an insulating barrier (Katsnelson et al. *Nat. Phys.* 2006, 2 (9), 620-625; Simmons et al. *J. Appl. Phys.* 1963, 34 (6), 1793-&). For such exponentially-decaying transport, it is reasonable to expect nonlinear response similar to a standard tunnel barrier without the zero-bias peak observed in the single-layer devices (consistent with the measurements of the bi-layer devices in FIG. 5d and FIG. 2f.

For the single-layer case in the strongly n-doped regime (at large positive gate voltages) we expect reduced transmission for Klein tunneling, which is consistent with the measured low-bias linear resistance in FIG. 4d (Low et al. *IEEE Trans. Electron Devices* 2009, 56 (6), 1292-1299; Huard et al. *Phys. Rev. Lett.* 2007, 98 (23), 236803; Xia et al. *Nat. Nanotechnol.* 2011, 6 (3), 179-184). In this n-doped regime the total effective transmission (which includes effects of scattering at the channel interfaces) becomes significantly reduced, which is in stark contrast to the high constant transmission, greater than 0.6, for the p-doped case (see Supporting Information section 6.1 and FIG. S8). The reduction in the effective transmission when the channel is strongly n-doped for $V_g - V_{CNP} \lesssim 8V$ corresponds well with the breakdown of the ballistic model in describing the measured nonlinearities (see Supporting Information section 5). This reduced transmission and breakdown of the nonlinear ballistic model for positive gates are likewise consistent with p-doping of the graphene in the source and drain regions under the Au, as is theoretically expected (Giovannetti et al. *Phys. Rev. Lett.* 2008, 101 (2)).

Figure 7H:
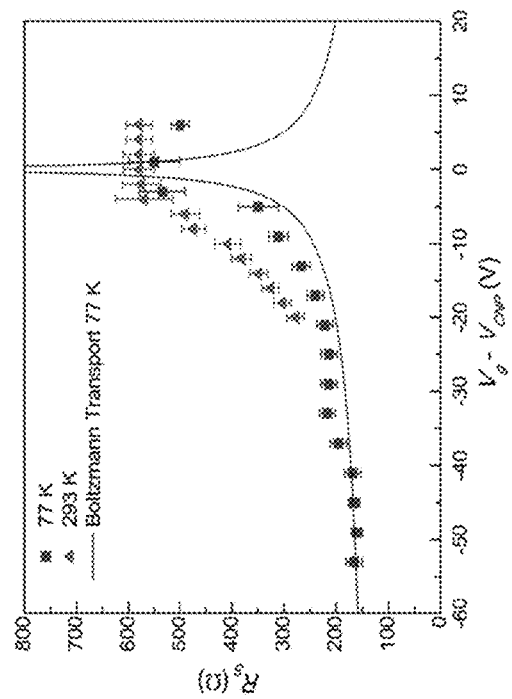

The nonlinear measurements at negative gates show excellent agreement with the intrinsic ballistic model at biases within the inflection points—a regime where the transmission through each mode of the channel should be nearly perfect (Grassi et al. *IEEE Trans. Electron Devices* 2013, 60 (1), 140-146; Katsnelson et al. *Nat. Phys.* 2006, 2 (9), 620-625). To perform a quantitative comparison over this extended regime we compare quartic fits of the calculated and measured $\partial V_b/\partial I$. A quartic fit (of the form $\partial V_b/\partial I = R_0 + a_4 I^4$, where $a_4$ is the quartic fitting coefficient) captures the essential features of the nonlinearities in the ballistic model over the relevant gate range in the experiments In FIG. 7h we compare this quartic fit for the theory and measurements at 77 K and find that they agree with each other over a ~30 V range of gate voltages (corresponding to a range of channel charge density from $9.5 \times 10^{11}$ cm$^{-2}$ to $3.1 \times 10^{12}$ cm$^{-2}$) and ~two-orders of magnitude variation in the quartic response. Moreover, the quantitative agreement up to room temperature suggests that ballistic transport effects could be achievable in ultra-short nanogap devices consisting of atomically-thin components in technologically-relevant environments, a result that has direct relevance to the goal of achieving the smallest and fastest electronics.

Methods:
Sample Fabrication

The graphene test devices used in these experiments are isolated on highly p-doped silicon substrates with 300 nm of thermally grown $SiO_2$ (Novoselov et al. *Science* 2004, 306, 666-669). To eliminate any environmental doping effects when preparing the graphene samples, the substrates are cleaned in a glove bag and the graphene exfoliated in a dry $N_2$ environment (Sundararajan et al. *Appl Phys Lett* 2013, 103 (25), 253505). Graphene flakes are then optically identified and the thickness is confirmed by Raman microscopy using a 633 nm wavelength incident laser (Ferrari et al. *Phys. Rev. Lett.* 2006, 97, 187401; Gupta et al. *Nano Lett.* 2006, 6, 2667-2673). Electron beam lithography is used to create a Au bowtie geometry on top of graphene (Strachan et al. *Nano Lett.* 2006, 6, 441-444). This constriction geometry ensures the nanogap formed at a later stage is on top of graphene. Metal electrodes are fabricated by depositing gold of 30 nm thickness using an electron beam evaporator. The excess graphene not covered by gold electrodes is then etched using an oxygen plasma in a reactiveion etcher (Oxford instruments Plasmalab80plus) using the metal electrodes themselves as an etch mask (Lu et al. *Small* 2010, 6 (23), 2748-2754). The feedback controlled electromigration (FCE) process is carried out at a vacuum pressure $\lesssim 4 \times 10^{-5}$ Torr at room temperature (293 K), and the electrical characterization is carried out at either liquid nitrogen temperature (77 K) or at room temperature, as discussed in the main text. Both the FCE process and electrical characterization are carried out in a Lakeshore cryogenic probe station under vacuum, thereby avoiding ambient air contamination of the device.

Nanogap Formation

FCE is performed by ramping the bias voltage ($V_b$) across the bowtie metal electrodes while monitoring the current (Strachan et al. *Appl. Phys. Lett.* 2005, 86, 043109; Johnston et al. *Nano Lett.* 2007, 7, 2774-2777). When the two-probe resistance of the entire structure increases by a small ~2% change, a computer controlled voltage source ramps down $V_b$ by approximately 20% in order to arrest the electromigration of the metal. After this, the $V_b$ is ramped up again until another ~2% change is measured, and then ramped downward to arrest the electromigration. This procedure is continued until the metallic nanogap is completely formed over the graphene.

Electrical Measurements

The current-voltage ($I-V_b$) characteristics of the devices are measured by slowly sweeping $V_b$ starting from −400 mV to +400 mV and back, at 1 mV steps at a constant gate voltage ($V_g$). The current is then recorded by a Keithley 6517A Electrometer. After each $V_b$ sweep the gate voltage is stepped through a desired value in the range of ±60 V. Low bias ($V_b$=20 mV) gate sweeps are performed before and after each I–V$_b$ characterization test to make sure the graphene layers under the nanogap are preserved. All measurements reported are the current through the entire device and the V$_b$ applied to the samples by a digital to analog controller installed in a PC.

The foregoing has been presented for purposes of illustration and description. It is not intended to be exhaustive or to limit the embodiments to the precise form disclosed. Obvious modifications and variations are possible in light of the above teachings. All such modifications and variations are within the scope of the appended claims when interpreted in accordance with the breadth to which they are fairly, legally and equitably entitled. All documents referenced herein including patents, patent applications and journal articles and hereby incorporated by reference in their entirety.

What is claimed:

1. A non-volatile memory element, comprising an atomically-thin layer on top of a gate layer which is on top of a substrate, and a metallic layer with a bowtie geometry dispersed on top of the atomically-thin layer, wherein an electromigrated break junction in the metallic layer at the bowtie geometry provides well defined metallic interfaces and a clean nanogap channel of a width of about 0.1 nm to 10 nm entirely across the metallic layer that exposes the top of the atomically thin layer, such that the electromigrated break junction divides the metallic layer into a source electrode and a drain electrode that are separated by the clean nanogap, wherein the exposed atomically-thin layer functions as an ultra-short ballistic channel between the source and drain electrodes through the atomically thin layer over the gate layer and the substrate, and further wherein the substrate comprises an insulating material that supports charge trapping or a floating gate electrode.

2. The non-volatile memory element of claim 1, further comprising a dielectric layer between the gate layer and the atomically thin layer, wherein the dielectric material is selected from the group consisting of SiO$_2$, BN, Al$_2$O$_3$, and other similar insulating materials.

3. The non-volatile memory element of claim 2, wherein a floating gate is embedded in the dielectric layer.

4. The non-volatile memory element of claim 1, wherein the atomically thin layer comprises graphene, transition metal dichalcogenides, black phosphorous, or similar laminar or nanotube material.

5. The non-volatile memory element of claim 4, wherein the atomically-thin or nanotube material comprises a single layer.

6. The non-volatile memory element of claim 4, wherein the atomically-thin or nanotube material comprises two or more layers.

7. The non-volatile memory element of claim 1, wherein the gate layer is on top of a substrate.

8. The non-volatile memory element of claim 1, wherein the gate layer comprises a material selected from the group consisting of a metals, silicon, and graphene.

9. The non-volatile memory element of claim 1, wherein the metallic layer comprises a material that can be electromigrated, such as Au, Pd, Ag, Pt, Ni.

10. The non-volatile memory element of claim 1, wherein the metallic layer has a narrow constriction on the atomically-thin layer.

11. A non-volatile memory element, comprising an atomically-thin layer on top of a gate layer which is on top of a substrate, and a metallic layer with a bowtie geometry dispersed on top of the atomically-thin layer, wherein an electromigrated break junction in the metallic layer at the bowtie geometry provides well defined metallic interfaces and a clean nanogap channel of a width of about 0.1 nm to 10 nm entirely across the metallic layer that exposes the top of the atomically thin layer, such that the electromigrated break junction divides the metallic layer into a source electrode and a drain electrode that are separated by the clean nanogap, wherein the exposed atomically-thin layer functions as an ultra-short ballistic channel between the source and drain electrodes through the atomically thin layer over the gate layer and the substrate, and further wherein the atomically-thin layer comprises two or more layers.

12. The non-volatile memory element of claim 11, further comprising a dielectric layer between the gate layer and the atomically thin layer, wherein the dielectric material is selected from the group consisting of SiO$_2$, BN, Al$_2$O$_3$, and other similar insulating materials.

13. The non-volatile memory element of claim 12, wherein a floating gate is embedded in the dielectric layer.

14. The non-volatile memory element of claim 11, wherein the atomically thin layer comprises graphene, transition metal dichalcogenides, black phosphorous, or similar laminar or nanotube material.

15. The non-volatile memory element of claim 11, wherein the gate layer is on top of a substrate.

16. The non-volatile memory element of claim 11, wherein the gate layer comprises a material selected from the group consisting of a metals, silicon, and graphene.

17. The non-volatile memory element of claim 11, wherein the substrate comprises an insulating material that supports charge trapping or a floating gate electrode.

18. The non-volatile memory element of claim 11, wherein the metallic layer comprises a material that can be electromigrated, such as Au, Pd, Ag, Pt, Ni.

19. The non-volatile memory element of claim 11, wherein the metallic layer has a narrow constriction on the atomically-thin layer.

* * * * *